United States Patent
Kono et al.

(10) Patent No.: US 7,630,052 B2
(45) Date of Patent: Dec. 8, 2009

(54) EXPOSURE PROCESSING SYSTEM, EXPOSURE PROCESSING METHOD AND METHOD FOR MANUFACTURING A SEMICONDUCTOR DEVICE

(75) Inventors: Takuya Kono, Yokohama (JP); Nobuhiro Komine, Yokohama (JP); Tatsuhiko Higashiki, Fujisawa (JP); Shoichi Harakawa, Yokohama (JP); Makato Ikeda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1027 days.

(21) Appl. No.: 11/024,322

(22) Filed: Dec. 29, 2004

(65) Prior Publication Data

US 2005/0170262 A1     Aug. 4, 2005

(30) Foreign Application Priority Data

Jan. 5, 2004     (JP)     ............... 2004-000515

(51) Int. Cl.
G03B 27/32     (2006.01)
G03B 27/54     (2006.01)
G03D 5/00      (2006.01)
G03C 5/00      (2006.01)
H01L 21/00     (2006.01)

(52) U.S. Cl. ............ 355/27; 355/67; 396/611; 430/30; 430/311

(58) Field of Classification Search .......... 396/611; 430/30, 311; 355/27, 30, 53, 67
See application file for complete search history.

(56) References Cited

U.S. PATENT DOCUMENTS 5,723,237 A * 3/1998 Kobayashi et al. ............ 430/30
5,932,380 A * 8/1999 Yaegashi et al. ............. 430/30
6,599,670 B2    7/2003 Ikuno et al.
6,866,976 B2 * 3/2005 Asano et al. ............... 430/30
2002/0182521 A1 * 12/2002 Fujisawa et al. ............ 430/22

(Continued)

FOREIGN PATENT DOCUMENTS

| JP | 05-029203 | 2/1993 |
| JP | 09-080764 | 3/1997 |
| JP | 09-260275 | 10/1997 |
| JP | 11-297584 | 10/1999 |
| JP | 2002-134395 | 5/2002 |

(Continued)

OTHER PUBLICATIONS

English translation of JP 2003-318092 (dated Nov. 7, 2003).*

(Continued)

*Primary Examiner*—Alan A Mathews
(74) *Attorney, Agent, or Firm*—Finnegan, Henderson, Farabow, Garrett & Dunner, L.L.P.

(57)     ABSTRACT

An exposure processing system comprises an exposure apparatus to expose a resist on a wafer, a heating apparatus comprising heating apparatus units, the heating apparatus heating the exposed resist by a heating apparatus unit in the heating apparatus units, a developing apparatus comprising developing apparatus units, the developing apparatus developing the exposed and heated resist by a developing apparatus unit in the developing apparatus units, and a control apparatus to control the exposure apparatus by using correction data so that a wafer on process object being exposed, the correction data being data for correcting a dimensional dispersion of a resist pattern caused by a pair of heating apparatus unit and developing apparatus unit used for the wafer on the process object, the pair of heating and developing apparatus unit comprising a heating and developing apparatus unit in the heating and developing apparatus used for the wafer on the process object.

15 Claims, 13 Drawing Sheets

U.S. PATENT DOCUMENTS

2003/0054642 A1* 3/2003 Kagotani et al. ............ 438/689
2003/0215724 A1 11/2003 Asano et al.
2005/0105068 A1 5/2005 Komine

FOREIGN PATENT DOCUMENTS

| JP | 2002-182729 | 6/2002 |
|---|---|---|
| JP | 2003-282663 | 10/2003 |
| JP | 2003-318092 | 11/2003 |

OTHER PUBLICATIONS

English translation of JP 2002-182729 (dated Jun. 26, 2002).*

English translation of JP 11-297584 (dated Oct. 29, 1999).*

English translation of JP 05-029203 (dated Feb. 5, 1993).*

Notification of Reasons for Rejection from the Japanese Patent Office, mailed Oct. 31, 2006, in Japanese Patent Application No. 2004-00515 and English translation thereof.

Notification of Reasons for Rejection from the Japanese Patent Office, mailed Mar. 27, 2007 in Japanese Patent Application No. 2004-000515 and English translation thereof.

* cited by examiner

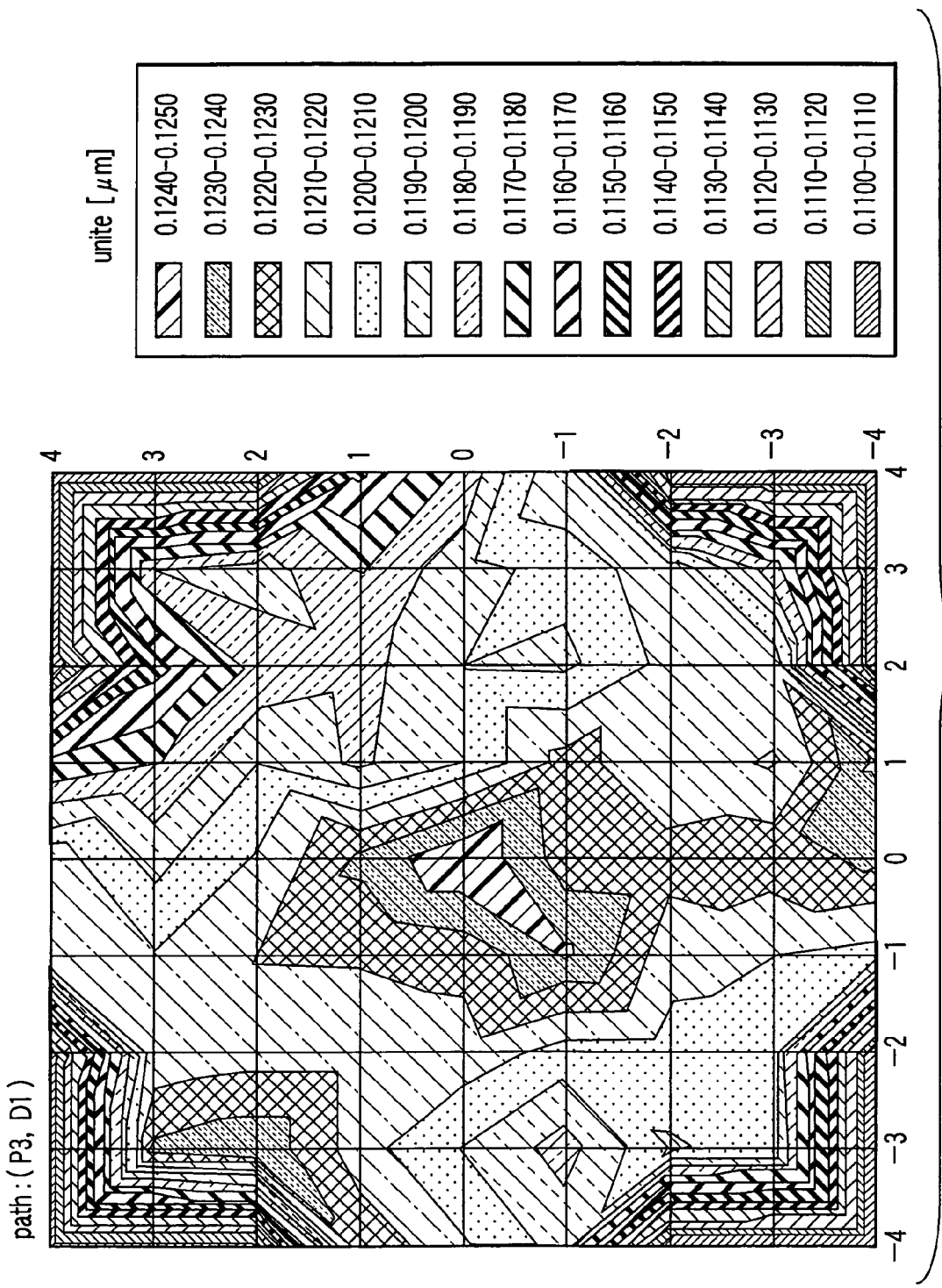
F I G. 6

| Lot name | Corrected value | |
|---|---|---|
| | Parameter A | Parameter B |
| A | a | b |

| Lot name | Wafer No. | Default path | Corrected value | |
|---|---|---|---|---|
| | | | Parameter A | Parameter B |
| A | 1 | P1D1 | a | b |
| | 2 | P2D1 | e | f |
| | 3 | P3D1 | I | j |
| | 4 | P1D2 | c | d |
| | 5 | P2D2 | g | h |
| | 6 | P3D2 | k | l |
| | 7 | P1D1 | a | b |
| | 8 | P2D1 | e | f |

FIG. 12

| Lot name | Wafer No. | Path |
|---|---|---|
| A | 1 | P1D1 |
| | 2 | P1D2 |
| | 3 | P2D1 |
| | 4 | P2D2 |
| | 5 | P3D1 |
| | 6 | P3D2 |
| | 7 | P1D1 |
| | 8 | P1D2 |

FIG. 13

| Lot name | Wafer No. | Path | Corrected value | |
|---|---|---|---|---|
| | | | Parameter A | Parameter B |
| A | 1 | P1D1 | a | b |
| | 2 | P1D2 | c | d |
| | 3 | P2D1 | e | f |
| | 4 | P2D2 | g | h |
| | 5 | P3D1 | I | i |
| | 6 | P3D2 | k | l |
| | 7 | P1D1 | a | b |
| | 8 | P1D2 | c | d |

FIG. 14

EXPOSURE PROCESSING SYSTEM, EXPOSURE PROCESSING METHOD AND METHOD FOR MANUFACTURING A SEMICONDUCTOR DEVICE

CROSS-REFERENCE TO RELATED APPLICATIONS

This application is based upon and claims the benefit of priority from prior Japanese Patent Application No. 2004-000515, filed Jan. 5, 2004, the entire contents of which are incorporated herein by reference.

BACKGROUND OF THE INVENTION

1. Field of the Invention

The present invention relates to an exposure processing system, an exposure processing method and a method for manufacturing a semiconductor device for forming a fine pattern.

2. Description of the Related Art

The performance of the semiconductor device is greatly dependent on the dimensional accuracy of a fine pattern. One of the most important problems relating to the dimensional accuracy is how to decrease dimensional dispersion in a wafer plane. The dimensional dispersion in the wafer plane is considered to include a dimensional dispersion caused by the exposure apparatus, a dimensional dispersion caused by the coating-developing apparatus, and a dimensional dispersion caused by the mask process.

The dimensional dispersion in the wafer plane is also generated among a plurality of wafers in the same lot. The dimensional dispersion of this type is derived mainly from the exposure processing system. The exposure processing system comprises a coating-developing apparatus and an exposure apparatus.

The coating-developing apparatus comprises a hot plate apparatus including a plurality of hot plate apparatus units for PEB (Post Exposure Bake). The coating-developing apparatus further comprises a developing apparatus including a plurality of developing apparatus units. The plurality of hot plate apparatus units has individual differences. Likewise, the plurality of developing apparatus units have individual differences. Therefore that, even if the PEB treatment and the development are carried out under the same conditions, the dimensional dispersion in the wafer plane tend to be different depending on the hot plate apparatus unit and the developing apparatus unit that to be used.

It is possible to control the dimensional dispersion in the wafer plane by controlling the controllable parameter (e.g. temperature) of the hot plate apparatus and the controllable parameter (e.g. heating time) of the developing apparatus.

However, it is very difficult to control the parameters referred to above in respect of all the combinations of the hot plate apparatus units and the developing apparatus units in a manner to suppress the dimensional dispersion in the wafer plane. Further, any publication has not yet been found in respect of the technology for suppressing the dimensional dispersion in the wafer plane in conjunction with all the combinations of the hot plate apparatus units and the developing apparatus units.

BRIEF SUMMARY OF THE INVENTION

According to an aspect of the present invention, there is provided an exposure processing comprising: an exposure apparatus to expose a resist on a wafer; a heating apparatus comprising a plurality of heating apparatus units, the heating apparatus heating the exposed resist on the wafer by a heating apparatus unit selected from the plurality of heating apparatus units; a developing apparatus comprising a plurality of developing apparatus units, the developing apparatus developing the exposed and heated resist on the wafer by a developing apparatus unit selected from the plurality of developing apparatus units; and a control apparatus to control the exposure apparatus by using correction data so that a wafer on process object being exposed, the correction data being data for correcting a dimensional dispersion of a resist pattern in a wafer plane caused by a pair of heating apparatus unit and developing apparatus unit used for the wafer on the process object, the pair of heating apparatus unit and developing apparatus unit comprising a heating apparatus unit in the plurality of heating apparatus units used for the wafer on the process object and a developing apparatus unit in the plurality of developing apparatus units used for the wafer on the process object.

According to an aspect of the present invention, there is provided an exposure processing method using an exposure processing system which comprises an exposure apparatus to expose a resist on a wafer; a heating apparatus comprising a plurality of heating apparatus units, the heating apparatus heating the exposed resist on the wafer by a heating apparatus unit selected from the plurality of heating apparatus units; and a developing apparatus comprising a plurality of developing apparatus units, the developing apparatus developing the exposed and heated resist on the wafer by a developing apparatus units selected from the plurality of developing apparatus units; the exposure processing method comprising: preparing an exposure amount to decrease a dimensional dispersion of a resist pattern in a wafer plane caused by a pair of heating apparatus unit selected from the plurality of heating apparatus used for heating the wafer on the process object and developing apparatus unit selected from the plurality of developing apparatus used for heating the wafer on the process object; and exposing the resist on the wafer on the process object by the exposure apparatus with the exposure amount.

According to an aspect of the present invention, there is provided a method for manufacturing a semiconductor device comprising: forming a resist on a wafer; exposing the resist and developing the exposed resist by an exposure processing method using an exposure processing system which comprises an exposure apparatus to expose a resist on a wafer; a heating apparatus comprising a plurality of heating apparatus units, the heating apparatus heating the exposed resist on the wafer by a heating apparatus unit selected from the plurality of heating apparatus units; and a developing apparatus comprising a plurality of developing apparatus units, the developing apparatus developing the exposed and heated resist on the wafer by a developing apparatus units selected from the plurality of developing apparatus units; the exposure processing method comprising: preparing an exposure amount to decrease a dimensional dispersion of a resist pattern in a wafer plane caused by a pair of heating apparatus unit selected from the plurality of heating apparatus used for heating the wafer on the process object and developing apparatus unit selected from the plurality of developing apparatus used for heating the wafer on the process object; and exposing the resist on the wafer on the process object by the exposure apparatus with the exposure amount; and etching the wafer using the developed resist as a mask.

BRIEF DESCRIPTION OF THE SEVERAL VIEWS OF THE DRAWING

FIG. 6 shows a dimensional dispersion in a wafer plane of a resist pattern formed on a wafer in respect of a wafer transfer path (P3, D1);

FIG. 12 schematically shows the correction data (exposure correcting amount) according to the embodiment;

FIG. 13 shows an example of new wafer transfer path in a case where the old wafer transfer path is equal to the default transfer path shown in FIG. 12;

FIG. 14 shows the new correction data of the wafer unit which corresponds to the new wafer transfer path shown in FIG. 13;

DETAILED DESCRIPTION OF THE INVENTION

An embodiment of the present invention will now be described with reference to the accompanying drawings.

Figure 1:
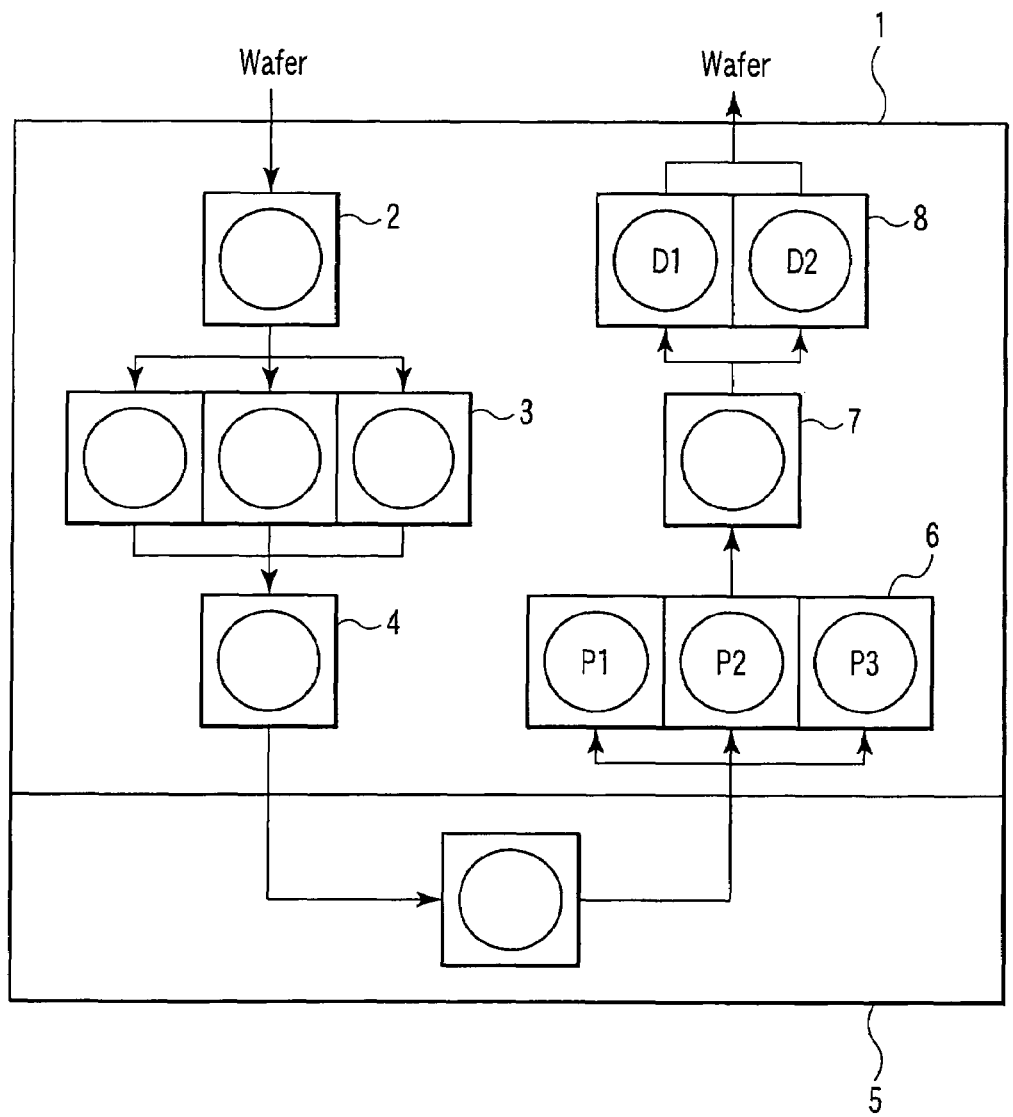
FIG. 1 shows a flow of the exposure processing using a known exposure processing system.
Figure 2:
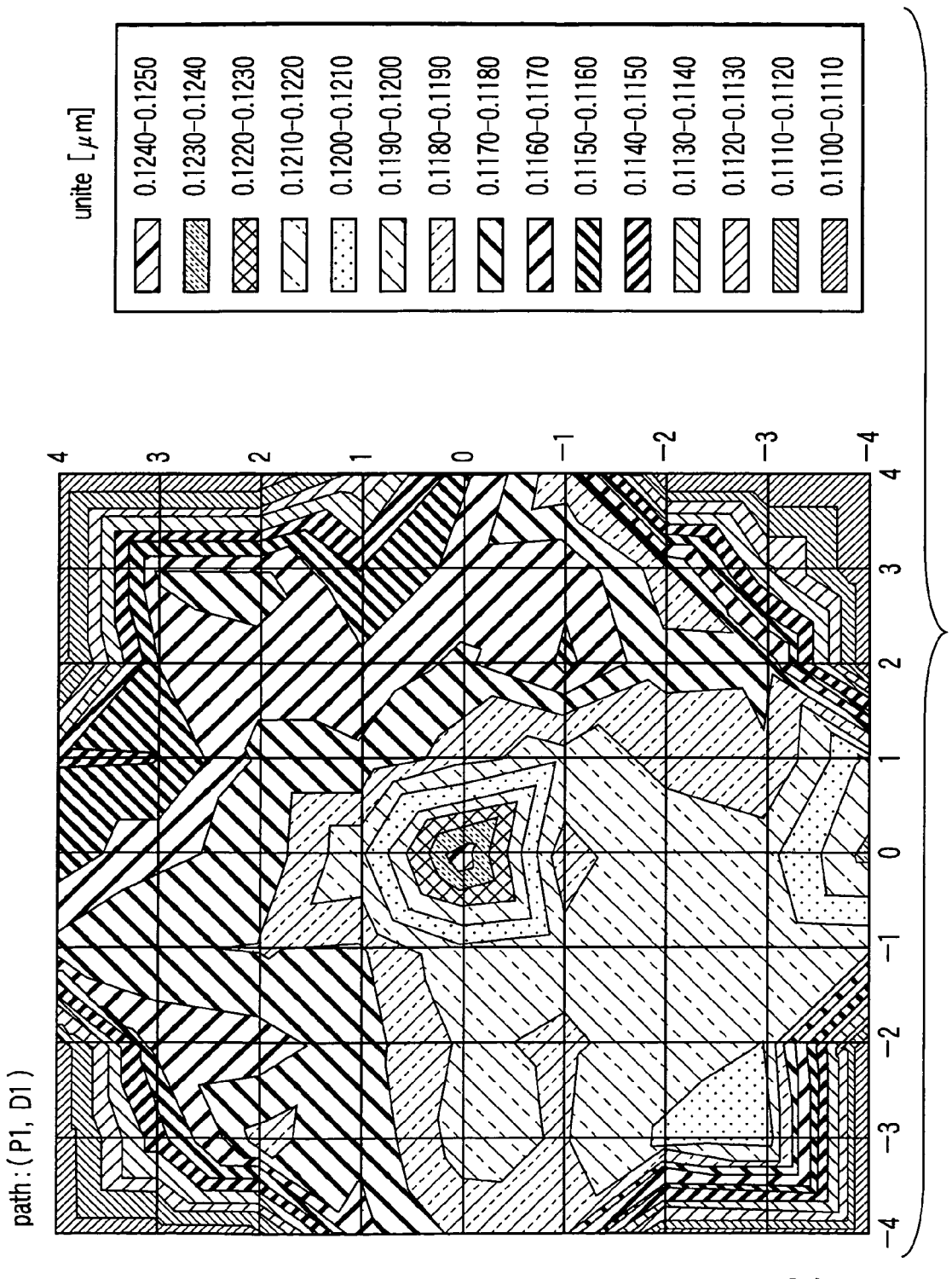
FIG. 2 shows a dimensional dispersion in a wafer plane of a resist pattern formed on a wafer in respect of a wafer transfer path (P1, D1)
Figure 3:
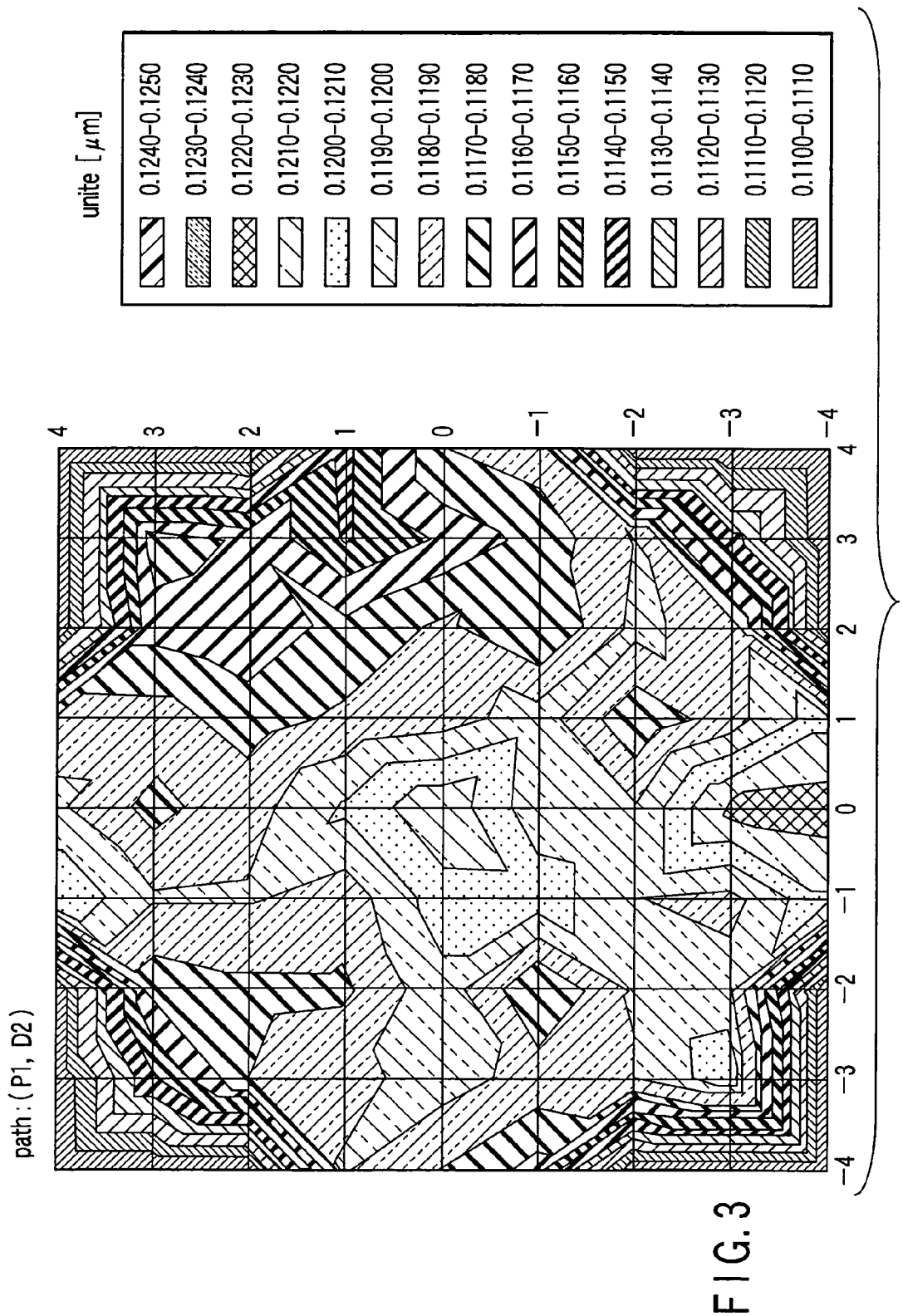
FIG. 3 shows a dimensional dispersion in a wafer plane of a resist pattern formed on a wafer in respect of a wafer transfer path (P1, D2)
Figure 4:
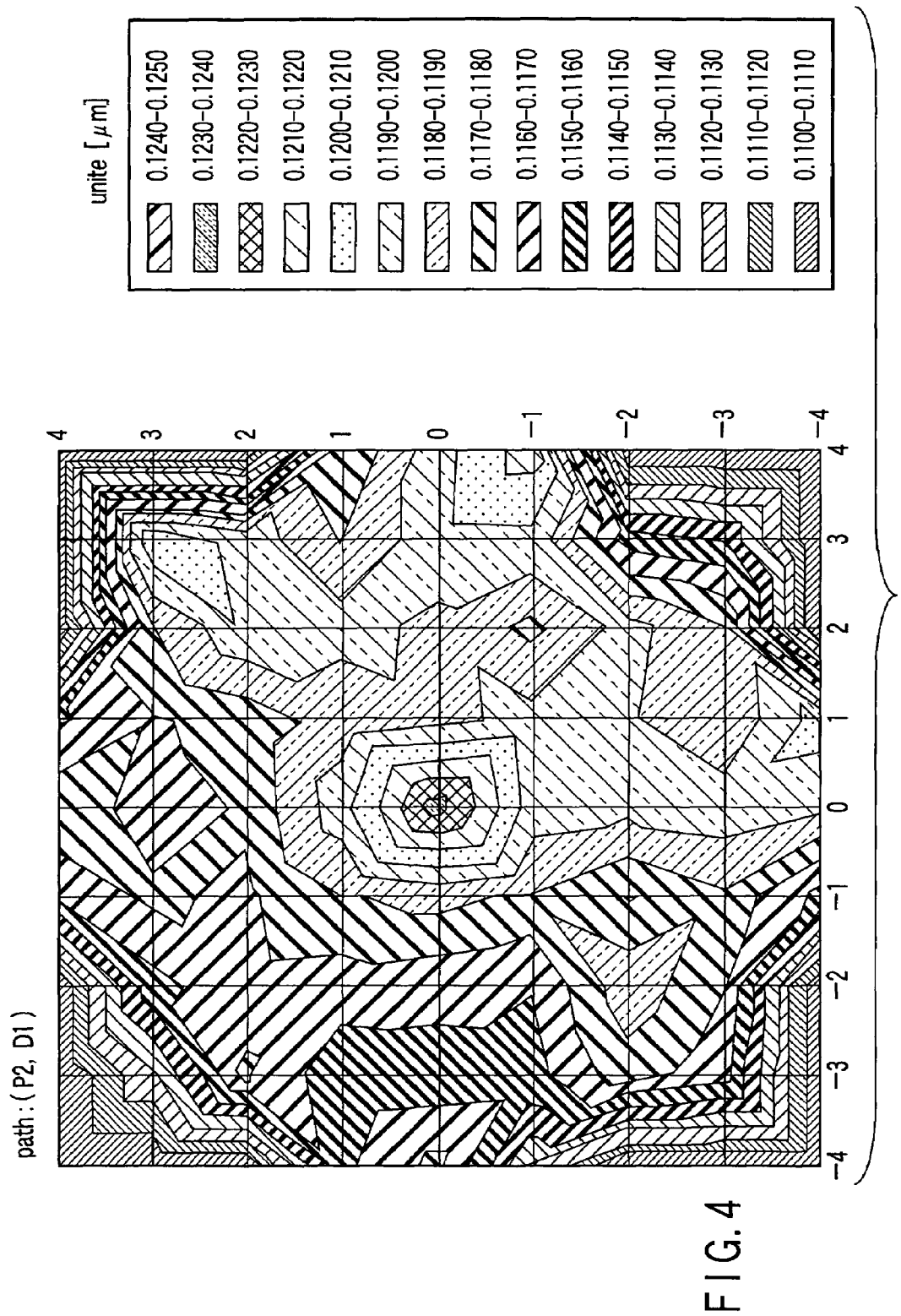
FIG. 4 shows a dimensional dispersion in a wafer plane of a resist pattern formed on a wafer in respect of a wafer transfer path (P2, D1)
Figure 5:
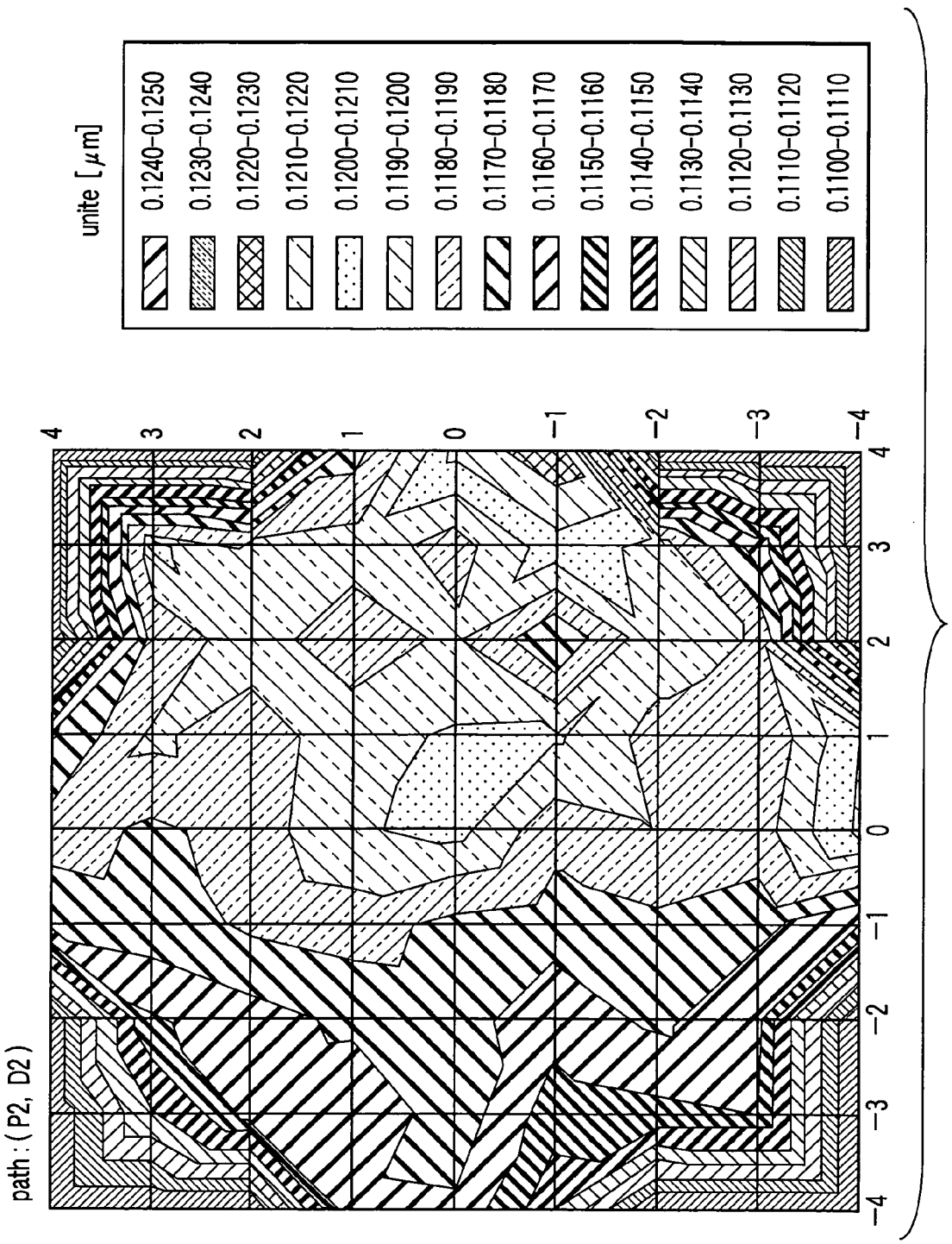
FIG. 5 shows a dimensional dispersion in a wafer plane of a resist pattern formed on a wafer in respect of a wafer transfer path (P2, D2)
Figure 7:
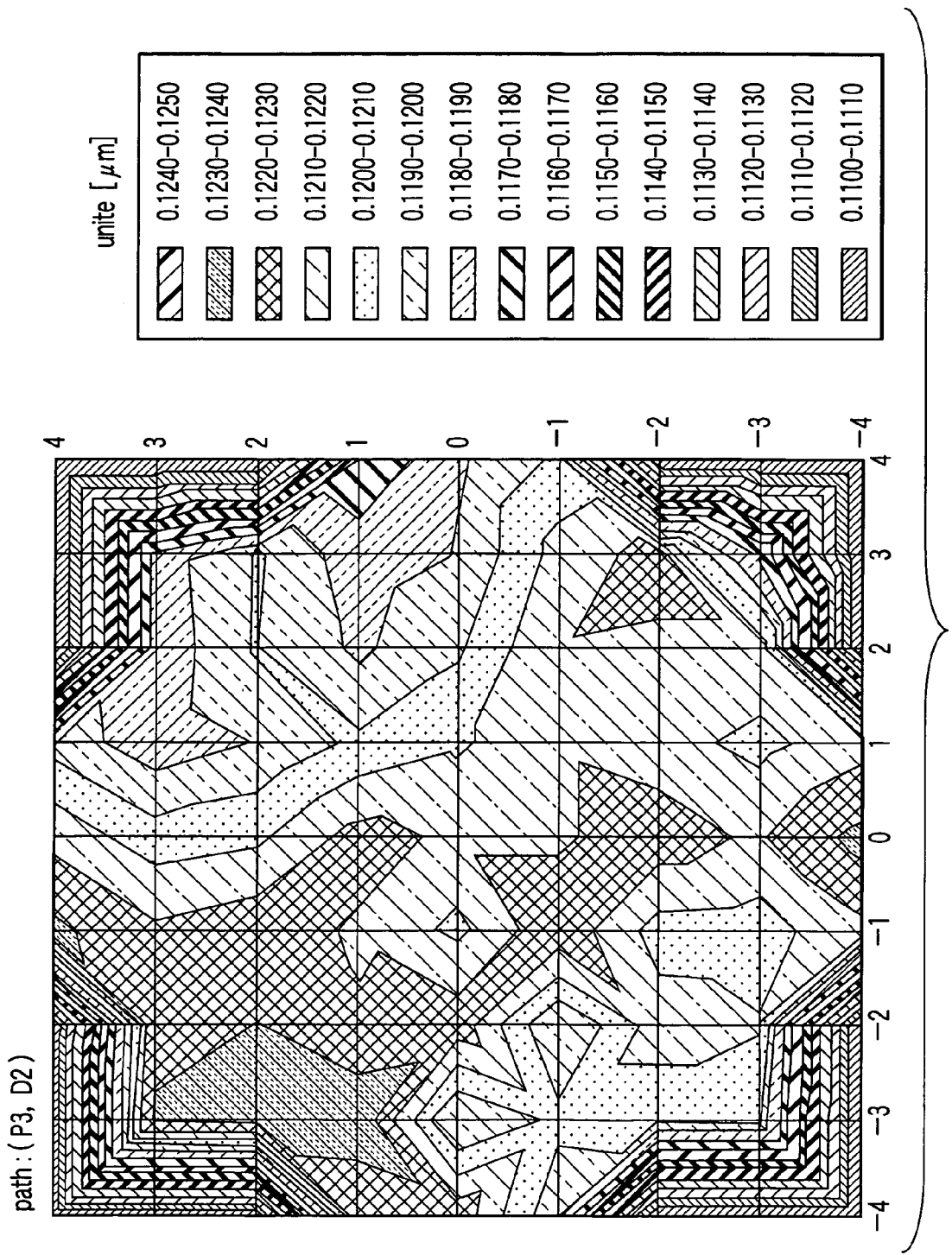
FIG. 7 shows a dimensional dispersion in a wafer plane of a resist pattern formed on a wafer in respect of a wafer transfer path (P3, D2)

FIG. 1 shows a flow of the exposure processing operation using a known exposure processing system.

At first, a wafer is transferred into a coating-developing apparatus 1, thereafter, a resist is coated on the wafer by a coating device (coater) 2. The wafer coated with the resist is pre-baked by a hot plate apparatus (pre-bake apparatus) 3. The pre-baked wafer is cooled down to a predetermined temperature by a cooling device 4.

Next, the wafer is transferred into an exposure apparatus 5. A mask pattern is transferred onto the resist on the wafer (resist) by the exposure apparatus 5.

Next, the wafer is transferred again into the coating-developing apparatus 1. The wafer is post-baked by a hot plate apparatus (post-bake apparatus) 6. The hot plate apparatus 6 comprises three hot plate apparatus units (heating apparatus units) P1 to P3. The wafer is heated (post-baked) by any of the three hot plate apparatus units P1 to P3. The post-baked wafer is cooled down to a predetermined temperature by a cooling device 7.

Next, the resist on the wafer is developed by a developing apparatus 8 so as to form a resist pattern. The developing apparatus 8 comprises two developing apparatus units D1 and D2. The resist pattern on the wafer is developed by one of the two developing apparatus units D1 and D2. Thereafter, the wafer is taken out of the exposure processing system, and known process such as an etching process or like that is subsequently carried out.

Concerning the combinations of the hot plate apparatus units P1 to P3 and the developing apparatus units D1, D2, there are six combinations of (P1, D1), (P1, D2), (P2, D1), (P2, D2), (P3, D1) and (P3, D2). In the following description, the combination of (Pi, Dj) is called a wafer transfer path.

FIGS. 2 to 7 show dimensional dispersion of the resist pattern formed on the wafer in the wafer plane (CD distribution) in the wafer transfer path (Pi, Dj). It is understood from FIGS. 2 to 7 that there is a certain tendency in terms of the dimensional dispersion for each of the wafer transfer paths.

Figures 8, 9:
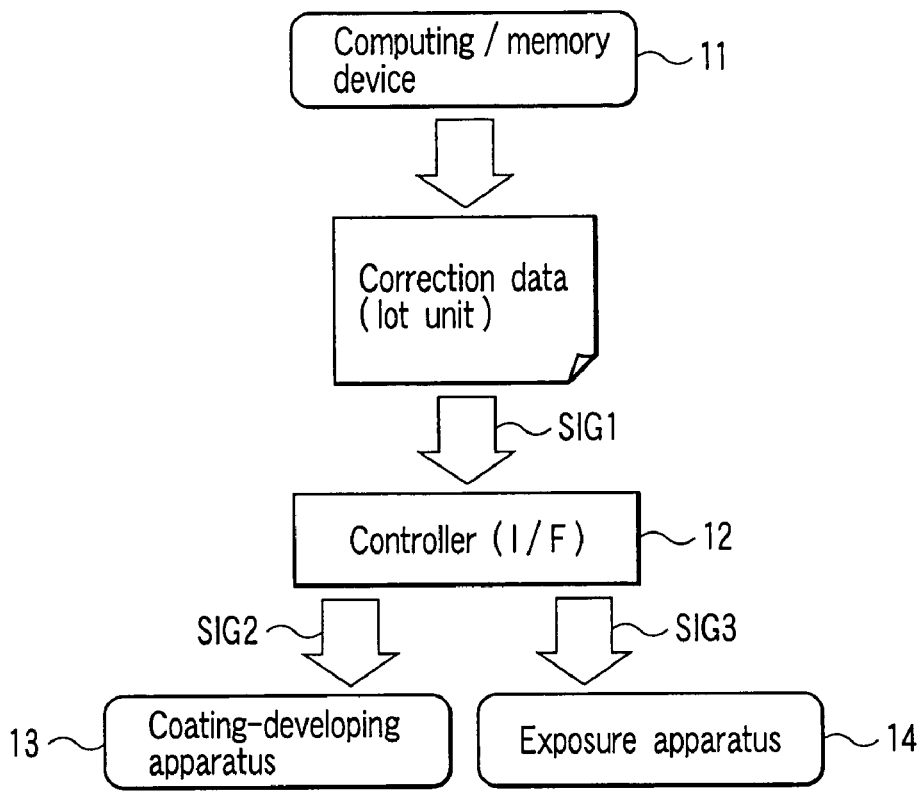
FIG. 8 schematically shows an exposure processing system equipped with a correcting function for suppressing the dimensional dispersion.
FIG. 9 schematically shows a correction data (corrected exposure amount) for correcting the dimensional dispersion in a wafer plane.

FIG. 8 schematically shows an exposure processing system equipped with a correcting function for suppressing the dimensional dispersion. The exposure processing system comprises an computing/memory device 11, a controller 12, a coating-developing apparatus 13 and an exposure apparatus 14.

The computing/memory device 11 comprises a computing device (an arithmetic calculation device) for obtaining a correction data by computing (arithmetic calculation) and a memory device for storing the data used for the computing (arithmetic calculation) and the other data such as the correction data or like that. The data stored in the memory device is transmitted to the controller 12 as a data signal SIG 1.

FIG. 9 schematically shows a correction data for correcting the dimensional dispersion in the wafer plane. The correction data is the correction data of a lot unit associated with the name of the lot. Therefore, a common correcting value is used for a plurality of wafers within the same lot. Incidentally, values (a, b) of two parameters, i.e., parameters A and B, are shown in FIG. 9 as the values of the correction data (correcting values). However, it is also possible to use the values of three or more parameters.

The controller 12 acts as an interface between the computing/memory device 11 and the coating-developing apparatus 13 and as an interface between the computing/memory device 11 and the exposure apparatus 14, and performs the function of controlling the coating-developing apparatus 13 and the exposure apparatus 14 by using the data stored in the memory device included in the computing/memory device 11.

The controller 12 serves to control the coating-developing apparatus 13 based on a control signal SIG 2 and to control the exposure apparatus 14 based on a control signal SIG 3. For example, the controller 12 transfers the control signal SIG 3 including the correction data (lot unit) stored in the memory device included in the computing/memory device 11 to the exposure apparatus 14 so as to control the exposure apparatus 14 such that the exposure is performed in a manner to suppress the dimensional dispersion in the wafer plane.

The construction and operation of the coating-developing apparatus 13 and the exposure apparatus 14 are equal to those of the coating-developing apparatus 1 and the exposure apparatus 5 shown in FIG. 1.

In the exposure processing system shown in FIG. 8, as the correction data of the lot unit is used, the dimensional dispersion generated by the difference in the wafer transfer path is not corrected. That is to say, it is impossible to resolve the problem in respect of the dimensional dispersion in the wafer plane among the plurality of wafers in the same lot.

Figure 10:
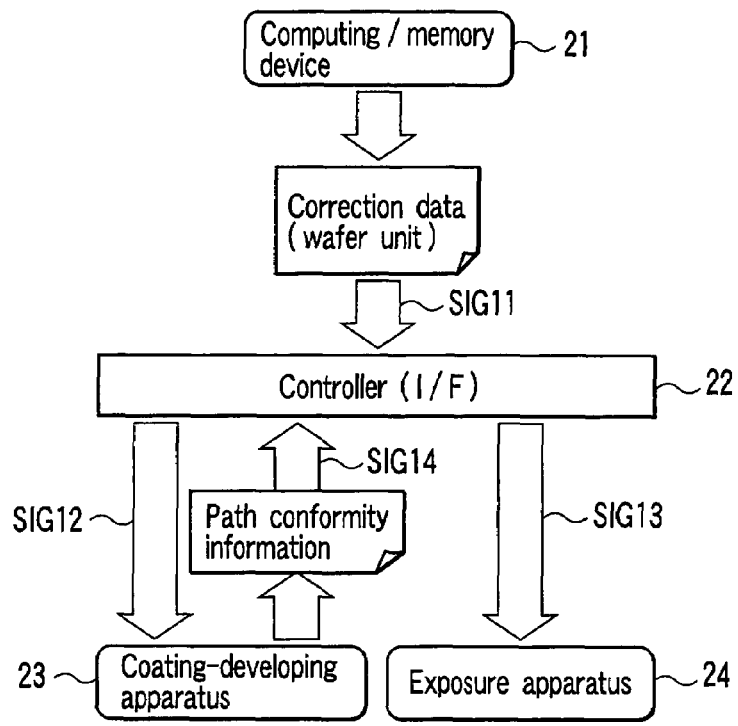
FIG. 10 schematically shows an exposure processing system equipped with a correcting function for suppressing the dimensional dispersion according to an embodiment.
Figure 11:
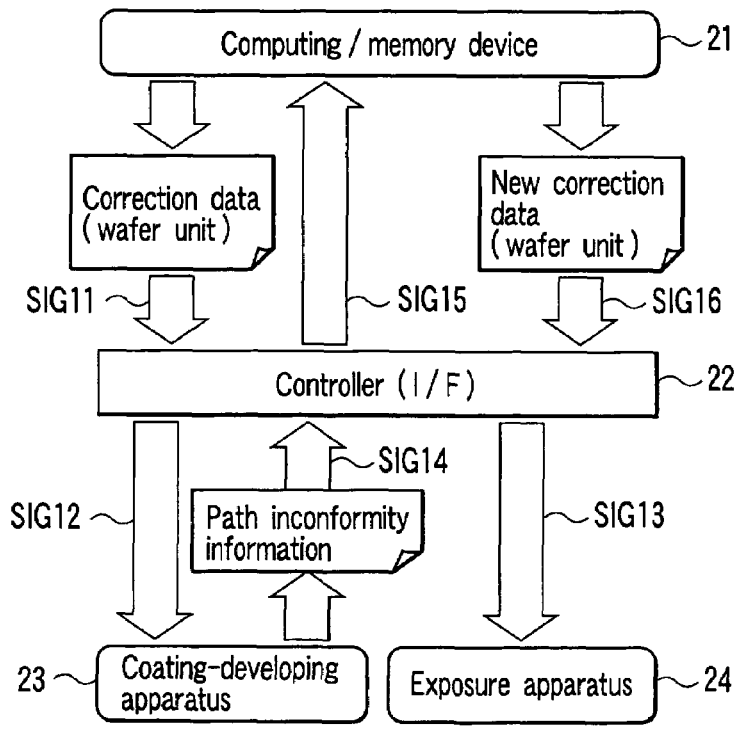
FIG. 11 schematically shows an exposure processing system equipped with a correcting function for suppressing the dimensional dispersion according to the embodiment.

FIGS. 10 and 11 schematically show the exposure processing system comprising a correcting function for suppressing the dimensional dispersion of the present embodiment. FIG. 10 shows the flow of the signal (data) in a case where there is no change in the wafer transfer path (default transfer path), and FIG. 11 shows the flow of the signal (data) in a case where there is a change in the wafer transfer (in a case where other than the default transfer path). Each signal (data) is transmitted and received between the devices on the on-line basis.

The exposure processing system of the present embodiment comprises a computing/memory device 21, a controller 22, a coating-developing apparatus 23 and an exposure apparatus 24.

The computing/memory device 21 comprises a computing device (an arithmetic calculation device) for obtaining, for example, the correction data by computing (arithmetic calculation) and a memory device for storing the data used for the computing (arithmetic calculation) and other data such as the correction data of the wafer unit or like that. The data stored in the memory device is transmitted to the controller 22 as a data signal SIG 11. The data signal SIG 11 includes, for example, the correction data of the wafer unit (wafer transfer path and the correcting exposure amount).

FIG. 12 schematically shows the correction data for correcting the dimensional dispersion in the wafer plane of the present embodiment. The correction data of the present embodiment is the correction data of a wafer unit associated with the numbers (wafer numbers) labeled on a plurality of wafers constructing the lot. Further, the wafer number is associated with the order of the exposure processing. Therefore, an appropriate correction data is used for each of the plurality of wafers in the lot.

Incidentally, the values (a, b) of two parameters, i.e., parameters A and B, are shown in FIG. 12 as the values of the correction data (correcting values). However, it is also possible to use the values of three or more parameters. Also, wafer numbers 1 to 8 are shown in FIG. 12. However, it is also possible to use 9 or more wafers or 7 or less wafers. In FIG. 12, each of the wafer transfer paths is the default transfer path.

The controller 22 is used as an interface between the computing/memory device 21 and the coating-developing apparatus 23 and as an interface between the computing/memory device 21 and the exposure apparatus 24, and performs the function of controlling the coating-developing apparatus 23 and the exposure apparatus 24 by using the data stored in the memory device included in the computing/memory device 21. The controller 22 serves to permit the coating-developing apparatus 23 to be controlled by a control signal SIG 12 and to permit the exposure apparatus 24 to be controlled by a control signal SIG 13.

The construction and operation of the coating-developing apparatus 23 are basically equal to those of the coating-developing apparatus 1 shown in FIG. 1, except that the coating-developing apparatus 23 performs the function of transmitting a path information signal SIG 14 including, for example, the information on the wafer transfer path (schedule information) or like that to the controller 22.

The exposure processing method using the exposure processing system according to the present embodiment will now be described.

At first, the first wafer on the lot process object is transferred into the coating-developing apparatus 23, thereafter, as in exposure processing system shown in FIG. 1, from the coating step by the coating device 2 to the cooling step by the cooling device 4 are carried out (step S1).

On the other hand, before the wafer is exposed by the exposure device 5, it is judged whether the wafer transfer path (new wafer transfer path) of the lot processing that is now being carried out is equal to the wafer transfer path (old wafer transfer path) that was already known before the start of the lot processing, e.g., the wafer transfer path that was used in the previous lot processing, or equal to the default transfer path (step S2).

The conformity or inconformity between the new wafer transfer path and the old wafer transfer path is judged when, for example, the wafer is present within the coating-developing apparatus 23, to be more specific, before the wafer is subjected to the pre-bake processing by the coating-developing apparatus 23 or during the pre-bake processing. The judgment is performed as follows.

The old wafer transfer path is stored in the coating-developing apparatus 23 and in the exposure apparatus 24. An example of the old wafer transfer path is the path which is transmitted from the controller 22 to the coating-developing apparatus 23 and the exposure apparatus 5 via the computing/memory device 21 during, the previous exposure processing.

On the other hand, the controller 22 transmits the control signal SIG 13 including the correction data of the wafer unit, which is stored in the memory device included in the computing/memory device 21, to the coating-developing apparatus 23 and the exposure apparatus 24. The correction data of the wafer unit includes the wafer transfer path (new wafer transfer path) as shown in FIG. 12. The coating-developing apparatus 23 compares the old wafer transfer path and the new wafer transfer path and judges the conformity or inconformity between the two paths That is to say, step S2 is carried out.

In a case where the new wafer transfer path conforms with the old wafer transfer path (in a case where there is no change in the wafer transfer path), as shown in FIG. 10, the coating-developing apparatus 23 transmits a path information signal SIG 14 including the information that the new wafer transfer path conforms with the old wafer transfer path (a path conformity information) to the controller 22 (step S3).

The controller 22 transmits the control signal SIG 13 to the exposure apparatus 24 so as to control the exposure apparatus 24 in a manner that the wafer on process object is exposed using the same correcting exposure amount equal to that in the case of the old wafer transfer path (step S4).

In this way, the exposure apparatus 24 is controlled by the controller 22 in a manner to suppress the dimensional dispersion of the resist pattern in the wafer plane for the first wafer after the post-baking.

And, when the second or after the second wafer in the lot is processed, the wafer on the process object is exposed using the correcting exposure amount equal to that in the case of the old wafer transfer path, then, the dimensional dispersion of the resist pattern in the wafer plane is suppressed (step S5).

On the other hand, in a case where the new wafer transfer path does not conform with the old wafer transfer path (in a case where a change has taken place in the wafer transfer path), as shown in FIG. 11, the coating-developing apparatus 23 transmits the path information signal SIG 14 including the information that the new wafer transfer path does not conform with the old wafer transfer path (path inconformity information) to the controller 22, as shown in FIG. 11 (step S6). FIG. 13 shows an example of the new wafer transfer path in a case where the old wafer transfer path is equal to the default transfer path shown in FIG. 12.

The controller 22 transmits a path information signal SIG 15 including the path inconformity information to the computing/memory device 11 (step S7).

The computing/memory device 21 calculates the correction data of the wafer unit corresponding to the new wafer transfer path (new correction data) based on the data relating to the new wafer transfer path and the information relating to the correction data of the wafer unit corresponding to the old wafer transfer path (step S8). FIG. 14 shows the new correction data of the wafer unit corresponding to the new wafer transfer path shown in FIG. 13.

The computing/memory device 21 transmits a correction data signal SIG 16 including the new correction data to the controller 22 (step S9).

The controller 22 transmits the control signal SIG 13 including the new correction data to the exposure apparatus 24 so as to control the exposure apparatus 24 in a manner that the wafer on the process object is exposed using the correcting exposure amount included in the new correction data (step S10).

In this way, even where a change has taken place in the wafer transfer path, the exposure apparatus 24 is controlled by the controller 22 in a manner to suppress the dimensional dispersion of the resist pattern in the wafer plane for the first wafer after the post-baking.

And, when the second or after the second wafer in the lot is processed, the wafer on the process object is exposed using the correcting exposure amount in the new correction data, then, the dimensional dispersion of the resist pattern in the wafer plane is suppressed (step S11).

Thereafter, the wafer is etched using the resist pattern as a mask. The wafer includes, for example, an insulating film, a semiconductor film or a conductive (metal) film. When the wafer is etched, the insulating film, the semiconductor film or the conductive (metal) film is etched. The insulating film is a silicon oxidation film, a high dielectric constant film or a low dielectric constant film. The high dielectric constant film is, for example, a HfSiON film. The low dielectric constant film is, for example, a porous low-k film. As the high dielectric constant film is etched, for example, a gate insulating film is formed. As the low dielectric constant film is etched, for example, a via hole is formed in an interlayer insulating film.

Figure 15:
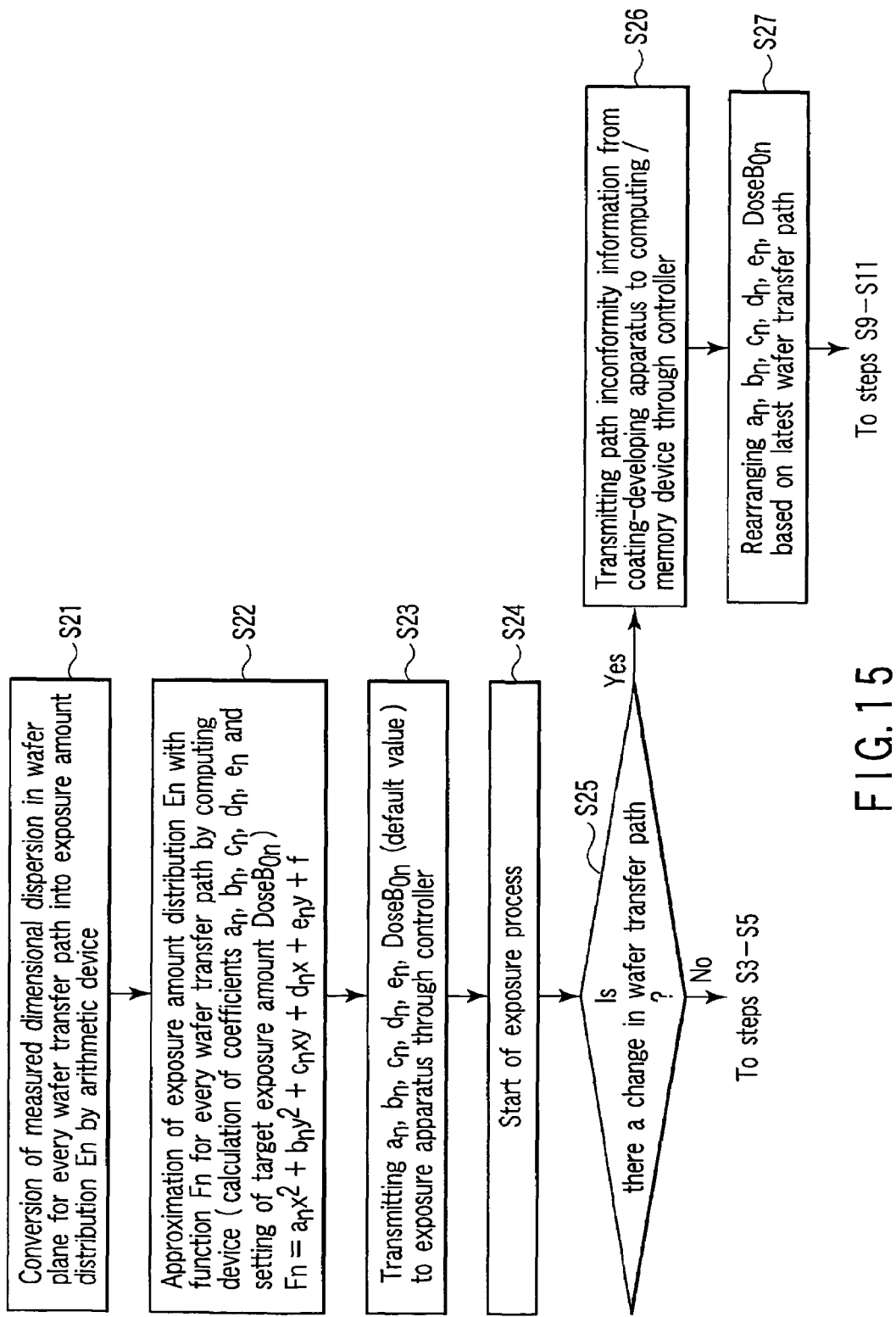
FIG. 15 is a flow chart showing the exposure processing method for the first lot according to the embodiment.
Figure 16:
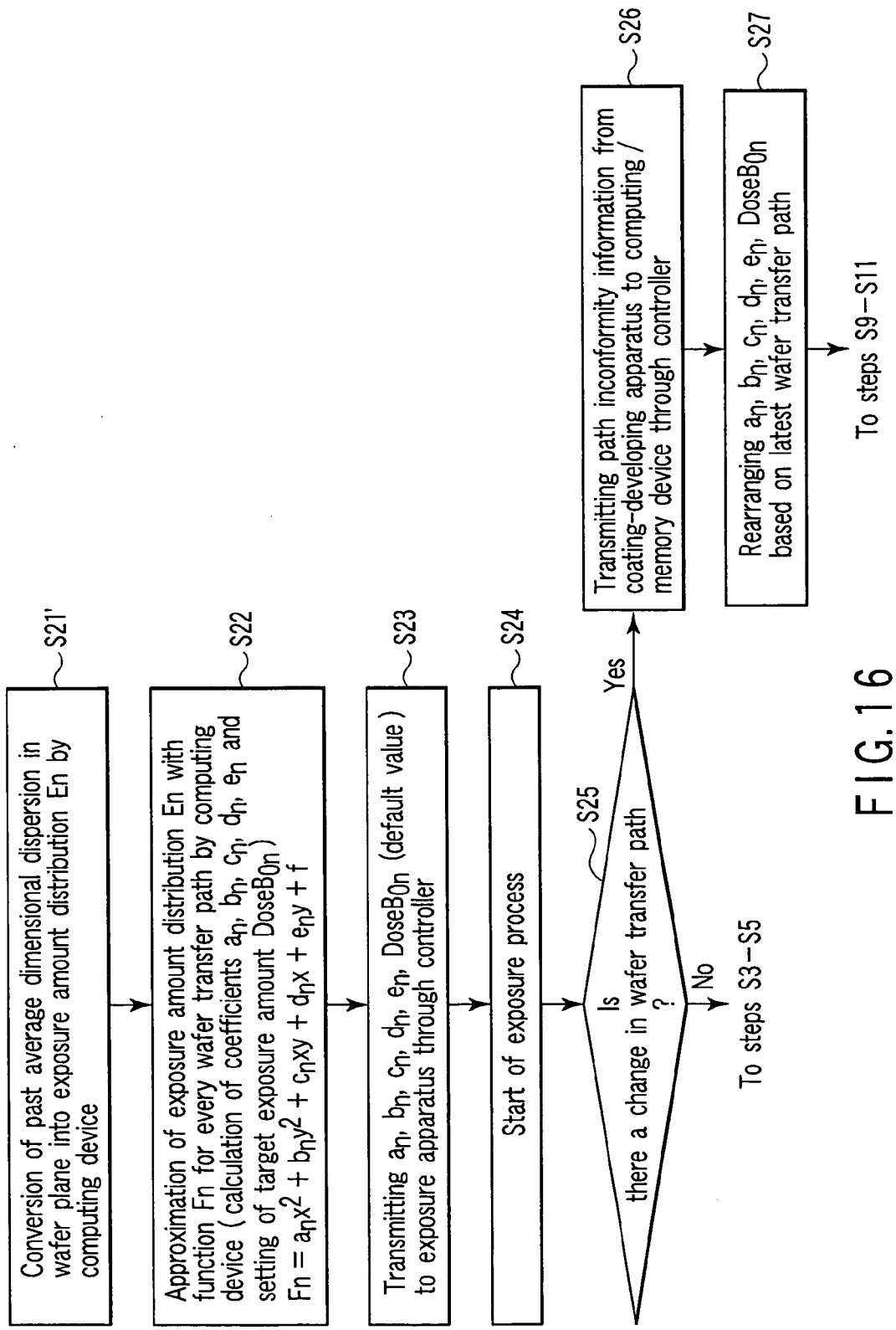
FIG. 16 is a flow chart showing the exposure processing method for the second lot et seq. according to the embodiment.

Next, the exposure processing method according to the present embodiment will now be described in detail with reference to FIGS. 15 and 16. FIG. 15 is a flow chart showing the exposure processing method for the first lot, and FIG. 16 is a flow chart showing the exposure processing method for the second lot or thereafter lot.

On the other hand, as an exposure apparatus, a type of exposure apparatus which irradiates a photomask including a pattern with electromagnetic wave (for example, light or UV-ray) or charged particles (for example, electrons or ions), introducing an image of the pattern onto a wafer mounted on a stage via a projection optical system, and transferring the pattern onto the wafer by moving a position of the stage in two dimensional directions is used case is explained. The specific exposure apparatus of this type is, for example, an electron beam exposure apparatus.

At first, the dimensional dispersion of the resist pattern in the wafer plane for each wafer transfer path, which is obtained in advance by a measuring apparatus such as a CD-SEM, is converted into the exposure amount distribution En in the wafer plane for each wafer transfer path by the computing device (step S21)(step S21).

"n" takes the value falling within a range of between 1 and the number of existing wafer transfer paths. The computing device is typically a computing device included in the computing/memory device 21, though it is possible to use another computing device.

Next, each of the exposure amount distribution En is approximated (represented) by a quadratic function, and the target exposure amount $DoseB_{0n}$ is set (step S22).

In the present embodiment, the exposure amount distribution En is approximated by $a_n x^2 + b_n y^2 + c_n xy + d_n x + e_n y + f_n$ which is a quadratic function of x and y. The coefficients $a_n$, $b_n$, $c_n$, $d_n$, $e_n$, and $f_n$ are calculated by the computing/memory device 11.

The x denotes an arbitrary point on the one axis of the two dimensional coordinates, the y denotes an arbitrary point on the another axis of the two dimensional coordinates. In the case of using the electron beam exposure apparatus, one coordinate axis (x-axis) and the other coordinate axis (y-axis) of the two dimensional coordinates correspond to the X-axis and the Y-axis of the X-Y stage of the electron beam exposure apparatus.

In the present embodiment, the exposure amount distribution En is approximated by the quadratic function. However, it is possible to approximate the exposure amount distribution En by a function of three or higher order.

Next, the coefficients $a_n$, $b_n$, $c_n$, $d_n$, $e_n$, $f_n$ calculated in the step 22 and the target exposure amount $DoseB_{0n}$ (default value) are transmitted to the exposure apparatus 24 via the controller 22 (step S23).

Next, the exposure processes (pre-bake step, exposure step, post-bake step, developing step) of n-number of the wafers are started by the exposure processing system (step S24).

In the exposure step, the exposure apparatus 24 is set at "$E = DoseB - (ax^2 + by^2 + cxy + dx + ey + f)$" by the controller 22. The dimensional dispersion of the resist pattern in the wafer plane is suppressed as the wafer is exposed by the exposure apparatus 24 under the setting conditions.

The setting condition is not limited to the formula. For example, "$E = DoseB - (gx^4 + hx^3 y + ix^2 y^2 + jxy^3 + ky^4 + lx^3 + mx^2 y + nxy^2 + oy^3 + px^2 + qxy + ry^2 + sx + ty + u)$" can be used. Where g, h, i, j, k, l, m, n, o, p, q, r, s, t and u denote coefficients.

On the other hand, after the exposure process and before the wafer is transferred into the exposure apparatus 24, i.e., when the wafer is present in the coating-developing apparatus 23, it is judged whether or not there is a change in the wafer transfer path after the exposure step (step S25). The step S25 corresponds to step S2 described previously.

With the result that there is no change in the wafer transfer path after the exposure step (FIG. 10), the steps S3 to S5 described previously are carried out.

On the other hand, in a case where there is a change in the wafer transfer path after the exposure step (FIG. 11), at first, the path inconformity information (SIG 14, SIG 15) is transmitted from the coating-developing apparatus 23 to the computing/memory device 21 via the controller 22 (step S26). The step S26 corresponds to step S7 described previously.

Next, the coefficients of $a_n$, $b_n$, $c_n$, $d_n$, $e_n$, $f_n$, and $DoseB_{0n}$ (correcting parameter value) are rearranged by the computing/memory device 21 based on the new wafer transfer path, and the new correction data corresponding to the new wafer transfer path is calculated (step S27). Step S27 corresponds to step S8 described previously.

Thereafter, the steps S9 to S11 described previously are followed. In this case, the new correction data in steps S9 to S11 are read as $a_n$, $b_n$, $c_n$, $d_n$, $e_n$, $f_n$, and $DoseB_{0n}$ based on the new wafer transfer path. For example, in step S9, the computing/memory device 21 transmits the correction data signal SIG 16 including the rearranged coefficients of $a_n$, $b_n$, $c_n$, $d_n$, $e_n$, $f_n$, and $DoseB_{0n}$ based on the new wafer transfer path to the controller 22.

On the other hand, in the exposure processing method for the second or thereafter lot, the distribution which is obtained by converting the average of dimensional dispersion of the resist pattern in the wafer plane in the past into the exposure amount distribution En for each of the wafer transfer path as the correction data is used as an exposure amount distribution En (step S21'). The others are equal to the exposure processing method for the first lot.

Incidentally, in the present embodiment, the correcting exposure amount is determined in a manner to suppress the dimensional dispersion of the resist pattern in the wafer plane. Further, after the exposure processing, the correcting exposure amount (coefficients of a function of two or higher order) can be determined so that a dimensional dispersion of a finished pattern (e.g., gate electrode pattern, contact hole pattern, wiring trench pattern) in the wafer plane is reduced. The finished pattern is obtained by etching process using the resist pattern.

Figure 17:
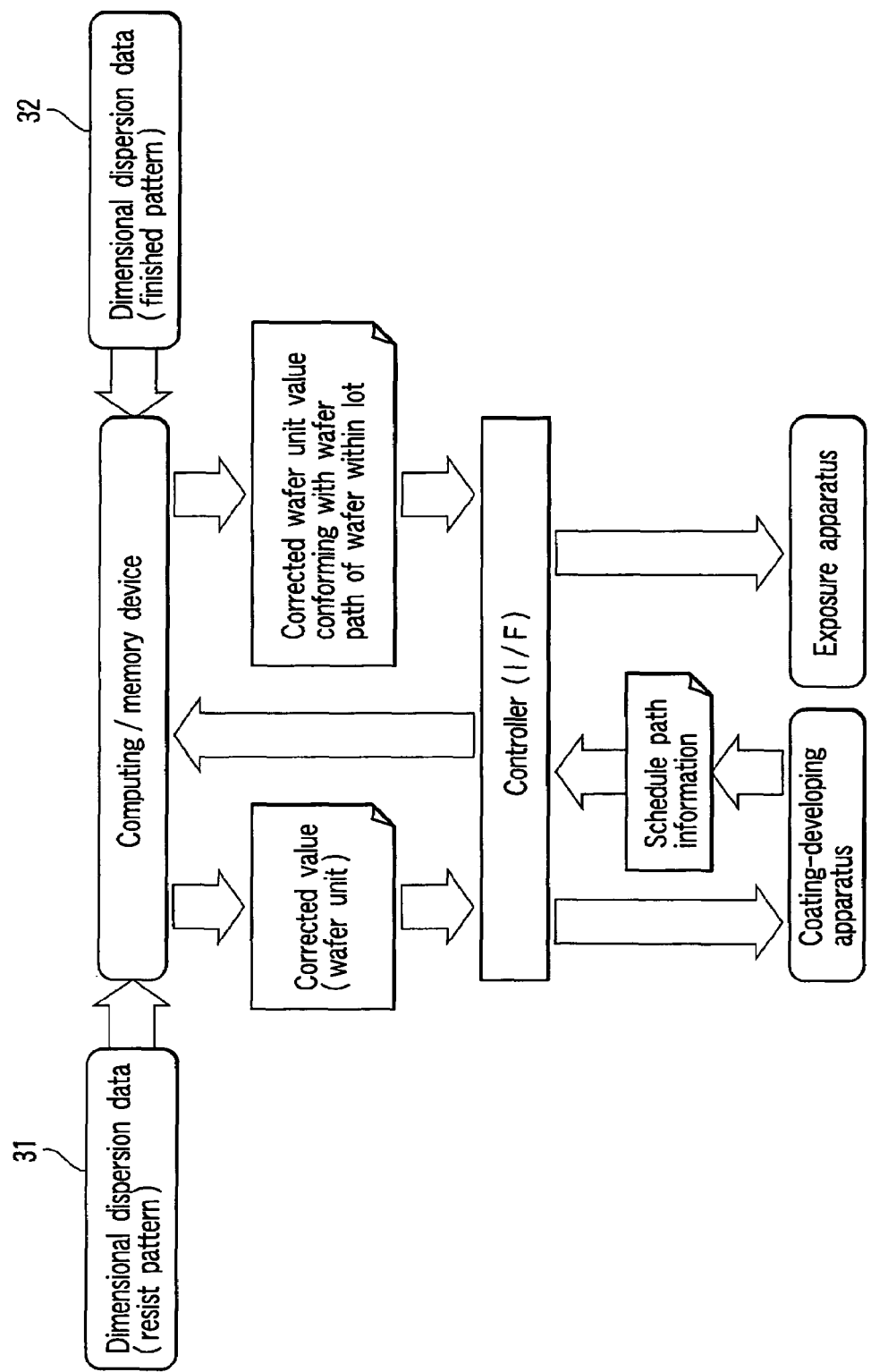
FIG. 17 schematically shows an exposure processing system equipped with a correcting function for suppressing the dimensional dispersion according to a modification example.

FIG. 17 schematically shows the exposure processing system (a modified example) capable of performing a correcting function for suppressing the dimensional dispersion of the resist pattern and finished pattern in the wafer plane. FIG. 17 corresponds to the figure which combines FIGS. 10 and 11.

A reference numeral 31 shown in FIG. 17 denotes the data relating to the dimensional dispersion of the resist pattern in the wafer plane for every wafer transfer path, which is obtained in advance by using a measuring apparatus such as a CD-SEM. A reference numeral 32 denotes the data relating to the dimensional dispersion of the finished pattern in the wafer plane for every wafer transfer path, which is obtained in advance by using a measuring apparatus such as a CD-SEM.

In the case of the modified example, in the step S21, for example, the computing device 21 obtains the sum of the dimensional dispersion of the resist pattern and the dimensional dispersion of the finished pattern (dispersive sum) for each of the wafer transfer path using the data 31, 32, further, the computing device 21 converts each of the dispersive sum into the exposure amount distribution En in the wafer plane for every wafer transfer path. The modified example is equal to the present embodiment in the other respects.

The present embodiment is directed to the case where the wafer transfer path in which a plurality of hot plate apparatus units forming a pre-bake device is not taken into account. However, it is also possible to employ the wafer transfer path in which the plural hot plate apparatus units are taken into account. That is to say, any apparatus which affects the dimensional dispersion in the wafer plane as the apparatus forming the wafer transfer path.

In the present embodiment, the pre-bake apparatus and the developing apparatus alone are taken into account. These two kinds of the apparatuses have been found to give a particularly large influence to the dimensional dispersion. Thus, these two kinds of the apparatuses are taken into account in the present embodiment.

Also, the present embodiment can be performed as a computer program product (e.g., CD-ROM, DVD) in which a program for allowing a system including a computer to execute the method of exposure processing of the present embodiment is recorded.

That is, the computer program product is configured to store program instructions for execution on the computer system enabling the computer system to perform an exposure processing method using an exposure processing system which comprises an exposure apparatus to expose a resist on a wafer; a heating apparatus comprising a plurality of heating apparatus units, the heating apparatus heating the exposed resist on the wafer by a heating apparatus unit selected from the plurality of heating apparatus units; and a developing apparatus comprising a plurality of developing apparatus units, the developing apparatus developing the exposed and heated resist on the wafer by a developing apparatus units selected from the plurality of developing apparatus units; the exposure processing method comprising: preparing an exposure amount to decrease a dimensional dispersion of a resist pattern in a wafer plane caused by a pair of heating apparatus unit selected from the plurality of heating apparatus used for heating the wafer on the process object and developing apparatus unit selected from the plurality of developing apparatus used for heating the wafer on the process object; and exposing the resist on the wafer on the process object by the exposure apparatus with the exposure amount.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An exposure processing system comprising:
an exposure apparatus to expose a resist on a wafer;
a heating apparatus comprising a plurality of heating apparatus units, the heating apparatus heating the exposed resist on the wafer by a heating apparatus unit selected from the plurality of heating apparatus units;
a developing apparatus comprising a plurality of developing apparatus units, the developing apparatus developing the exposed and heated resist on the wafer by a developing apparatus unit selected from the plurality of developing apparatus units; and
a control apparatus to control the exposure apparatus by using correction data so that a wafer on a process object is exposed, the correction data being data for correcting a dimensional dispersion of a resist pattern in a wafer plane caused by a pair of a heating apparatus unit and a developing apparatus unit used for the wafer on the process object, the pair comprising a heating apparatus unit of the plurality of heating apparatus units used for the wafer on the process object and a developing apparatus unit of the plurality of developing apparatus units used for the wafer on the process object,
wherein the exposure apparatus is a type of exposure apparatus that irradiates a photomask including a pattern with an electromagnetic wave or charged particles, introducing an image of the pattern onto a wafer mounted on a stage via a projection optical system, and transferring the pattern onto the wafer by moving a position of the stage in two dimensional directions, the correction data includes data represented by a function with at least second orders of variables of x and y, wherein the x denotes a point on one coordinate axis and y denotes a point on the other coordinate axis of two dimensional coordinates for representing an arbitrary point on the wafer.

2. The exposure processing system according to claim 1, wherein the exposure apparatus is set to meet an equation of "$E=DoseB-(ax^2+by^2+cxy+dx+ey+f)$", where:

E denotes a set exposure amount at the points x and y for the exposure apparatus;

DoseB denotes a target exposure amount at the points x and y; and a, b, c, d, e and f denote coefficients of the function with the at least second orders of variables.

3. The exposure processing system according to claim 1, further comprising:

a memory device to store a plurality of wafers on exposure process objects and a plurality of correction data corresponding to the plurality of wafers, the plurality of correction data being data for correcting a dimensional dispersion of a resist pattern in a wafer plane caused by a plurality of pairs of a heating apparatus unit and a developing apparatus unit used for the plurality of wafers on the process objects, each of the plurality of pairs of a heating apparatus unit and a developing apparatus unit comprising a heating apparatus unit of the plurality of heating apparatus units used for the wafer on the process object and a developing apparatus unit of the plurality of developing apparatus units used for the wafer on the process object.

4. The exposure processing system according to claim 1, further comprising:

a memory device to store a plurality of wafers on exposure process objects and a plurality of correction data corresponding to the plurality of wafers, the plurality of correction data being data for correcting a dimensional dispersion of a resist pattern in a wafer plane caused by a plurality of pairs of a heating apparatus unit and a developing apparatus unit used for the plurality of wafers on the process objects, each of the plurality of pairs of a heating apparatus unit and a developing apparatus unit comprising a heating apparatus unit of the plurality of heating apparatus units used for the wafer on the process object and a developing apparatus unit of the plurality of developing apparatus units used for the wafer on the process object.

5. The exposure processing system according to claim 2, further comprising:

a memory device to store a plurality of wafers on exposure process objects and a plurality of correction data corresponding to the plurality of wafers, the plurality of correction data being data for correcting a dimensional dispersion of a resist pattern in a wafer plane caused by a plurality of pairs of a heating apparatus unit and a developing apparatus unit used for the plurality of wafers on the process objects, each of the plurality of pairs of a heating apparatus unit and a developing apparatus unit comprising a heating apparatus unit of the plurality of heating apparatus units used for the wafer on the process object and a developing apparatus unit of the plurality of developing apparatus units used for the wafer on the process object.

6. An exposure processing method using an exposure processing system which comprises an exposure apparatus to expose a resist on a wafer, a heating apparatus comprising a plurality of heating apparatus units, the heating apparatus heating the exposed resist on the wafer by a heating apparatus unit selected from the plurality of heating apparatus units, and a developing apparatus comprising a plurality of developing apparatus units, the developing apparatus developing the exposed and heated resist on the wafer by a developing apparatus units selected from the plurality of developing apparatus units, the exposure processing method comprising:

preparing an exposure amount to decrease a dimensional dispersion of a resist pattern in a wafer plane caused by a pair of a heating apparatus unit selected from the plurality of heating apparatus units used for heating the wafer on the process object and a developing apparatus unit selected from the plurality of developing apparatus units used for developing the wafer on the process object; and exposing the resist on the wafer on the process object by the exposure apparatus with the exposure amount, wherein the exposure apparatus is a type of exposure apparatus that irradiates a photomask including a pattern with an electromagnetic wave or charged particles, introducing an image of the pattern onto a wafer mounted on a stage via a projection optical system, and transferring the pattern onto the wafer by moving a position of the stage in two dimensional directions, the correction data includes data represented by a function with at least second orders of variables of x and y, wherein the x denotes a point on one coordinate axis and y denotes a point on the other coordinate axis of two dimensional coordinates for representing an arbitrary point on the wafer.

7. The exposure processing method according to claim 6, wherein the exposure apparatus is set to meet an equation of "$E=DoseB-(ax^2+by^2+cxy+dx+ey+f)$", where:

E denotes a set exposure amount at the points x and y for the exposure apparatus;

DoseB denotes a target exposure amount at the points x and y; and a, b, c, d, e and f denote coefficients of the function with the at least second orders of variables.

8. The exposure processing method according to claim 6, further comprising:

a memory device to store a plurality of wafers on exposure process objects and a plurality of correction data corresponding to the plurality of wafers, the plurality of correction data being data for correcting a dimensional dispersion of a resist pattern in a wafer plane caused by a plurality of pairs of a heating apparatus unit and a developing apparatus unit used for the plurality of wafers on the process objects, each of the plurality of pairs of a heating apparatus unit and a developing apparatus unit comprising a heating apparatus unit of the plurality of heating apparatus units used for the wafer on the process object and a developing apparatus unit of the plurality of developing apparatus units used for the wafer on the process object.

9. The exposure processing method according to claim 7, further comprising:

a memory device to store a plurality of wafers on exposure process objects and a plurality of correction data corresponding to the plurality of wafers, the plurality of correction data being data for correcting a dimensional dispersion of a resist pattern in a wafer plane caused by a plurality of pairs of a heating apparatus unit and a developing apparatus unit used for the plurality of wafers on the process objects, each of the plurality of pairs of a heating apparatus unit and a developing apparatus unit comprising a heating apparatus unit of the plurality of heating apparatus units used for the wafer on the process object and a developing apparatus unit of the plurality of developing apparatus units used for the wafer on the process object.

10. A method for manufacturing a semiconductor device comprising:

forming a resist on a wafer;

exposing the resist and developing the exposed resist by an exposure processing method using an exposure processing system which comprises an exposure apparatus to expose a resist on a wafer; a heating apparatus comprising a plurality of heating apparatus units, the heating apparatus heating the exposed resist on the wafer by a heating apparatus unit selected from the plurality of heating apparatus units; and a developing apparatus comprising a plurality of developing apparatus units, the developing apparatus developing the exposed and heated resist on the wafer by a developing apparatus units selected from the plurality of developing apparatus units;

the exposure processing method comprising:

preparing an exposure amount to decrease a dimensional dispersion of a resist pattern in a wafer plane caused by a pair of a heating apparatus unit selected from the plurality of heating apparatus units used for heating the wafer on the process object and a developing apparatus unit selected from the plurality of developing apparatus units used for developing the wafer on the process object; and exposing the resist on the wafer on the process object by the exposure apparatus with the exposure amount; and etching the wafer using the developed resist as a mask, wherein the exposure apparatus is a type of exposure apparatus that irradiates a photomask including a pattern with an electromagnetic wave or charged particles, introducing an image of the pattern onto a wafer mounted on a stage via a projection optical system, and transferring the pattern onto the wafer by moving a position of the stage in two dimensional directions, the correction data includes data represented by a function with at least second orders of variables of x and y, wherein the x denotes a point on one coordinate axis and y denotes a point on the other coordinate axis of two dimensional coordinates for representing an arbitrary point on the wafer.

11. The method for manufacturing a semiconductor device according to claim 10, wherein the exposure apparatus is set to meet an equation of "$E = \mathrm{Dose}B - (ax^2 + by^2 + cxy + dx + ey + f)$", where:

E denotes a set exposure amount at the points x and y for the exposure apparatus;

DoseB denotes a target exposure amount at the points x and y; and a, b, c, d, e and f denote coefficients of the function with the at least second orders of variables.

12. The method for manufacturing a semiconductor device according to claim 10, further comprising:

a memory device to store a plurality of wafers on exposure process objects and a plurality of correction data corresponding to the plurality of wafers, the plurality of correction data being data for correcting a dimensional dispersion of resist pattern in a wafer plane caused by a plurality of pairs of a heating apparatus unit and a developing apparatus unit used for the plurality of wafers on the process objects, each of the plurality of pairs of heating apparatus unit and developing apparatus unit comprising a heating apparatus unit of the plurality of heating apparatus units used for the wafer on the process object and a developing apparatus unit of the plurality of developing apparatus units used for the wafer on the process object.

13. The method for manufacturing a semiconductor device according to claim 11, further comprising:

a memory device to store a plurality of wafers on exposure process objects and a plurality of correction data corresponding to the plurality of wafers, the plurality of correction data being data for correcting a dimensional dispersion of a resist pattern in a wafer plane caused by a plurality of pairs of a heating apparatus unit and a developing apparatus unit used for the plurality of wafers on the process objects, each of the plurality of pairs of a heating apparatus unit and a developing apparatus unit comprising a heating apparatus unit of the plurality of heating apparatus units used for the wafer on the process object and a developing apparatus unit of the plurality of developing apparatus units used for the wafer on the process object.

14. The method for manufacturing a semiconductor device according to claim 10, wherein the wafer includes a high dielectric constant film or low dielectric constant film, the etching the wafer using the developed resist as the mask including etching the high dielectric constant film or the low dielectric constant film.

15. The method for manufacturing a semiconductor device according to claim 14, wherein the high dielectric constant film includes a HfSiON film, and the low dielectric constant film includes a porous low-k film.

* * * * *

UNITED STATES PATENT AND TRADEMARK OFFICE
CERTIFICATE OF CORRECTION

| | |
|---|---|
| PATENT NO. | : 7,630,052 B2 |
| APPLICATION NO. | : 11/024322 |
| DATED | : December 8, 2009 |
| INVENTOR(S) | : Kono et al. |

Page 1 of 1

It is certified that error appears in the above-identified patent and that said Letters Patent is hereby corrected as shown below:

Title page, item (75), in the Inventors section, line 5, change "Makato" to --Makoto--.

Claim 10, column 13, line 25, change "units" to --unit--.

Signed and Sealed this

Second Day of March, 2010

David J. Kappos
*Director of the United States Patent and Trademark Office*